United States Patent
McNamara et al.

(10) Patent No.: US 11,201,104 B2
(45) Date of Patent: Dec. 14, 2021

(54) THERMAL MANAGEMENT USING VARIATION OF THERMAL RESISTANCE OF THERMAL INTERFACE

(71) Applicant: Advanced Micro Devices, Inc., Santa Clara, CA (US)

(72) Inventors: Andrew J. McNamara, Austin, TX (US); Swagata P. Kalve, Austin, TX (US); Christopher M. Jaggers, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 59 days.

(21) Appl. No.: 16/729,924

(22) Filed: Dec. 30, 2019

(65) Prior Publication Data
US 2021/0202351 A1 Jul. 1, 2021

(51) Int. Cl.
*H01L 23/433* (2006.01)
*H01L 23/367* (2006.01)

(52) U.S. Cl.
CPC .......... *H01L 23/433* (2013.01); *H01L 23/367* (2013.01)

(58) Field of Classification Search
CPC ............................ H01L 23/433; H01L 23/367
See application file for complete search history.

(56) References Cited

U.S. PATENT DOCUMENTS

| 4,548,862 A | 10/1985 | Hartman |
| 7,876,565 B2 | 1/2011 | Hoivik et al. |
| 2005/0061496 A1 | 3/2005 | Matabayas, Jr. |
| 2005/0127500 A1 | 6/2005 | Colgan et al. |
| 2009/0277608 A1* | 11/2009 | Kamins ............ F28F 13/00 165/82 |
| 2015/0104678 A1* | 4/2015 | Kwak ............ H01M 10/655 429/10 |

FOREIGN PATENT DOCUMENTS

| KR | 10-2009-0132771 A | 12/2009 |
| KR | 10-2018-0059185 A | 6/2018 |

OTHER PUBLICATIONS

Dow Chemical Company, "DOWSIL™ TC-5022 Thermally Conductive Compound," Technical Sheet, 2017, 2 pages.
(Continued)

*Primary Examiner* — Peniel M Gumedzoe
(74) *Attorney, Agent, or Firm* — Zagorin Cave LLP

(57) ABSTRACT

A thermal management system includes an integrated circuit having an active side including a control circuit and a backside including a first set of electrodes distributed across the backside. The thermal management system includes a heat exchanger having a surface including a second set of electrodes. The thermal management system includes a thermal interface material including thermally conductive particles suspended in a fluid. The thermal interface material is disposed between the backside of the integrated circuit and the surface of the heat exchanger. The control circuit is configured to apply an electric field to the thermal interface material using a first electrode of the first set of electrodes and a second electrode of the second set of electrodes to excite at least some of the thermally conductive particles between the first electrode and the second electrode.

30 Claims, 4 Drawing Sheets

(56) References Cited

OTHER PUBLICATIONS

Funaki, M., et al., "Electromagnetophoretic Micro-Convection Around a Droplet in a Capillary," Analytical Sciences, Sep. 2017, vol. 33, pp. 1013-1019.

Hirschi, D., "Understanding Differences Between Thermal Interface Materials: Improve Your Ability to Specify the Optimum TIM," Dow Corning Case Study, Electronic Solutions, 2008, 4 pages.

Iliescu, C., et al., "Dielectrophoretic Field-Flow Method for Separating Particle Populations in a Chip with Asymmetric Electrodes," American Institute of Physics, 2009, 10 pages.

Jones, T., "Basic Theory of Dielectrophoresis and Electrorotation," IEEE Engineering in Medicine and Biology Magazine, Nov./Dec. 2003, pp. 33-42.

Kasetsirikul, S., et al., "The Development of Malaria Diagnostic Techniques: A review of the Approaches with Focus on Dielectrophoretic and Magnetophoretic Methods," Malaria Journal 15:358, Jul. 2016, 14 pages.

National Technology and Engineering Solutions of Sandia, LLC, "Magnetically Stimulated Flow Patterns Offer Strategy for Heat Transfer Problems," Mar. 6, 2014, 4 pages.

ScienceDirect, "Dielectrophoresis," downloaded from https://www.sciencedirect.com/topics/pharmacology-toxicology-and-pharmaceutical-science/dielectrophoresison Dec. 30, 2019, Elsevier B.V., 11 pages.

Solis, K., and Martin, J., "Field-Structured Magnetic Platelets as a Route to Improved Thermal Interface Materials," Journal of Applied Physics 111, 2012, 10 pages.

Velev, O., et al., "Particle-Localized AC and DC Manipulation and Electrokinetics," Annu. Rep. Prog. Chem., Sect. C, 2009, 105, pp. 213-246.

Wikipedia, "Dielectrophoresis," downloaded from https://en.wikipedia.org/w/index.php?title=Dielectrophoresis&oldid=917351030 on Dec. 30, 2019, 10 pages.

Wikipedia, "Thermal Interface Material," downloaded from https://en.wikipedia.org/w/index.php?title=Thermal_interface_material&oldid=888502357 on Dec. 30, 2019, 2 pages.

Wikipedia, "Thermal Grease," downloaded from https://en.wikipedia.org/w/index.php?title=Thermal_grease&oldid=902095441 on Dec. 30, 2019, 3 pages.

International Search Report and Written Opinion from related application PCT/US2020/066772, dated Apr. 26, 2021, 8 pages.

\* cited by examiner

THERMAL MANAGEMENT USING VARIATION OF THERMAL RESISTANCE OF THERMAL INTERFACE

BACKGROUND

Description of the Related Art

In general, thermal management techniques improve reliability and reduce or eliminate premature failure of an integrated circuit product due to heat generated by the integrated circuit product. Techniques used to cool integrated circuit products (e.g., heat sinks, forced air systems, fans, heat pipes, and thermoelectric devices) typically cool the entire integrated circuit product. Hot spots are relatively small areas or localized regions of the integrated circuit product that have a higher temperature in comparison to a temperature of the rest of the integrated circuit product. By cooling the entire integrated circuit product, conventional thermal management techniques can cause unnecessary over-cooling of an integrated circuit product prone to hot spots. Accordingly, techniques for localized cooling of hot spots of integrated circuit products are desired.

SUMMARY OF EMBODIMENTS OF THE INVENTION

In at least one embodiment, a thermal management system includes an integrated circuit having an active side including a control circuit and a backside including a first set of electrodes distributed across the backside. The thermal management system includes a heat exchanger having a surface including a second set of electrodes. The thermal management system includes a thermal interface material including thermally conductive particles suspended in a fluid. The thermal interface material is disposed between the backside of the integrated circuit and the surface of the heat exchanger. The thermal interface material is in contact with the backside of the integrated circuit and the surface of the heat exchanger. The control circuit is configured to apply an electric field to the thermal interface material using a first electrode of the first set of electrodes and a second electrode of the second set of electrodes to excite at least some of the thermally conductive particles between the first electrode and the second electrode.

In at least one embodiment, a method for thermal management of an integrated circuit product includes selecting a first electrode from a first set of electrodes distributed across a backside of an integrated circuit and a second electrode of a second set of electrodes of a surface of a heat exchanger. The method includes applying an electric field across a thermal interface material using the first electrode and the second electrode. The thermal interface material includes thermally conductive particles suspended in a fluid. The thermal interface material is disposed between the backside of the integrated circuit and the surface of the heat exchanger. The thermal interface material is in contact with the backside of the integrated circuit and the surface of the heat exchanger. The electric field excites at least some of the thermally conductive particles between the first electrode and the second electrode.

In at least one embodiment, a method for manufacturing a thermal management system includes providing an integrated circuit having an active side including a control circuit and a backside including a first set of electrodes distributed across the backside. The method includes providing a heat exchanger having a surface including a second set of electrodes. The method includes providing a thermal interface material including thermally conductive particles suspended in a fluid. The thermal interface material is disposed between the backside of the integrated circuit and the surface of the heat exchanger. The thermal interface material is in contact with the backside of the integrated circuit and the surface of the heat exchanger. The control circuit is configured to apply an electric field to the thermal interface material using a first electrode of the first set of electrodes and a second electrode of the second set of electrodes to excite at least some of the thermally conductive particles between the first electrode and the second electrode.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
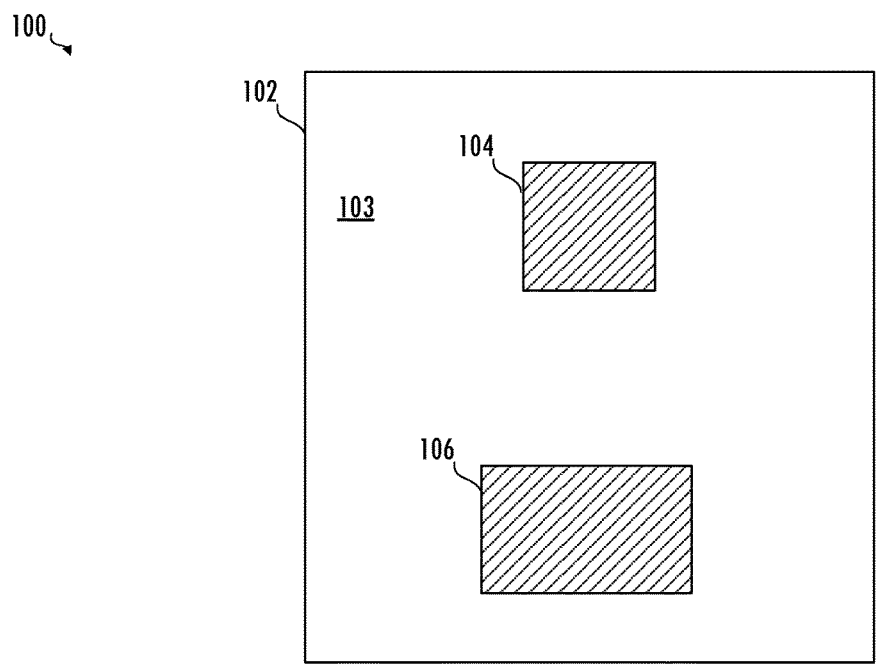
FIG. 1 illustrates an exemplary power density map of an integrated circuit product in operation.
Figure 2:
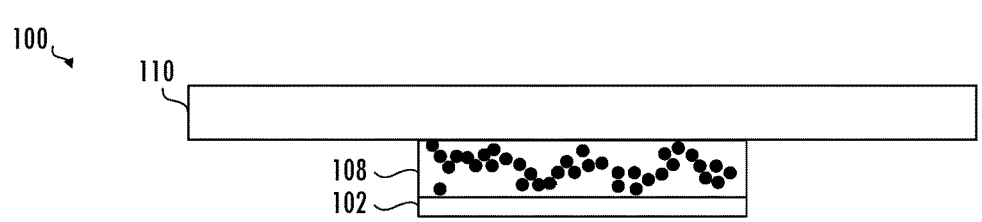
FIG. 2 illustrates an exemplary cross-sectional view of the integrated circuit product of FIG. 1.

Referring to FIGS. 1 and 2, an exemplary integrated circuit product (e.g., an integrated circuit die, a multi-chip module, or an integrated circuit die or multi-chip module attached to an interposer or package substrate) includes regions that operate with different power densities. For example, regions 104 and 106 operate with power densities that are higher than a power density of region 103. Region 104 may have the higher power density at a different time than region 106. Regions 104 and 106 generate associated hot spots on integrated circuit product 102. Exemplary thermal management system 100 includes heat exchanger 110 (e.g., heat spreader, heat sink, package lid, or other heat transferring structure) that is in contact with a surface of the integrated circuit product (e.g., a backside of an integrated circuit die in a flip chip arrangement, backside of a substrate attached to an integrated circuit die) via thermal interface material 108, which is between heat exchanger 110 and the surface of integrated circuit product 102. Heat exchanger 110 transfers thermal energy from integrated circuit product 102 at a high temperature to another object at lower temperature (e.g., air).

Thermal interface material 108 fills gaps between thermal transfer surfaces of integrated circuit product 102 and heat exchanger 110 to increase thermal transfer efficiency. In at least one embodiment, thermal interface material 108 is a fluid (e.g., a non-curing polymeric matrix, a silicone-based fluid, polysynthetic oil) to which thermally conductive particles (e.g., silver, aluminum, aluminum oxide, zinc oxide, boron nitride) are added to increase thermal conductivity (i.e., reduce thermal resistance) of the compound. In general, the thermally conductive particles are randomly dispersed throughout the fluid. Thermal interface material 108 has an effective thermal conductivity (e.g., 3-6 W/mK) that does not substantially change over time or operating conditions.

Figure 3:
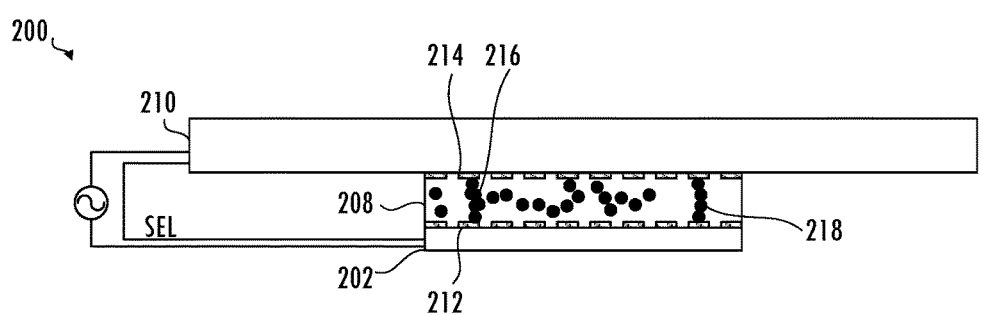
FIG. 3 illustrates a cross-sectional view of a thermal management system including a thermal interface material with a thermal resistance varied using an alternating current applied to electrodes consistent with at least one embodiment of the invention.

A thermal management technique increases the thermal conductivity of a thermal interface material in localized regions of the thermal interface material by aligning thermally conductive particles in the thermal interface material to form a high thermal conductivity pathway between a surface of the integrated circuit product and a surface of the heat exchanger. Referring to FIG. 3, thermal interface material 208 is a compound including a fluid (e.g., a non-curing polymeric matrix, a silicone-based fluid, polysynthetic oil) and thermally conductive particles (e.g., silver, aluminum, aluminum oxide, zinc oxide, boron nitride). The fluid has a viscosity (e.g., less than 250 Pascal seconds) sufficiently low to enable thermally conductive particles to move within the fluid of the compound. In at least one embodiment of thermal interface material 208, the thermally conductive particles are silver particles (e.g., microparticles or nanoparticles), which have a thermal conductivity of approximately 406 W/(mK), although other embodiments include gold, copper, or aluminum particles. In an embodiment, thermal interface material 208 has a thickness in a range of 20-100 Metal-based thermal interface materials can be electrically conductive and capacitive. If a metal-based thermal interface material is in contact with a circuit, the thermal interface material can cause the circuit to malfunction or damage the circuit. In at least one embodiment of thermal interface material 208, other thermally conductive particles that are electrical insulators are used (e.g., micronized diamond particles, which have a high thermal conductivity of approximately 1000 W/mK) may be used.

Figure 4:
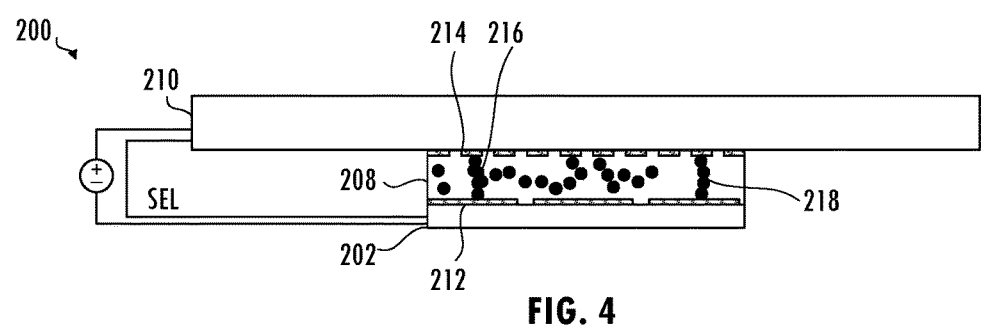
FIG. 4 illustrates a cross-sectional view of a thermal management system including a thermal interface material with a thermal resistance varied using a direct current applied to an asymmetric electrode pair consistent with at least one embodiment of the invention.

Referring to FIGS. 3 and 4, in at least one embodiment, thermal management system 200 uses dielectrophoretic force to polarize neutral thermally conductive particles, i.e., the thermally conductive particles, in thermal interface material 208. The dielectrophoretic force excites the particle, causes motion of the particle, or causes multiple particles to align between a hot spot of integrated product 202 and heat exchanger 210 to form high thermal conductivity path 216 between electrode 214 proximate to a hotspot of integrated circuit product 202 and electrode 212 of heat exchanger 210 (e.g., a heat spreader, a heat sink, or heat transfer structure). High thermal conductivity path 216 has a thermal resistance that is less than other portions of thermal interface material 208 having randomly distributed thermally conductive particles. In at least one embodiment, heat exchanger 210 has a contact surface that is smooth and flat for establishing thermal contact with a surface (e.g., backside of an integrated circuit die) of integrated circuit product 202. In other embodiments, heat exchanger 210 includes a contact surface that is textured (e.g., has a sawtooth surface) to increase the surface area for establishing thermal contact with another surface (e.g., backside of an integrated circuit die) of integrated circuit product 202. An exemplary sawtooth surface creates locations for electrodes in regions of increased surface area. In some embodiments, heat exchanger 201 includes a contact surface that includes smooth regions and also includes textured regions proximate to expected locations of hot spots. By exciting (e.g., polarizing in-place), concentrating, or aligning thermally conductive particles between a hot spot of integrated circuit product 202 and heat exchanger 210, thermal management system 200 reduces the effective thermal resistance of a high thermal conductivity path between the hot spot of integrated circuit product 202 and heat exchanger 210, as compared to regions of the thermal interface material 208 having randomly distributed thermally conductive particles.

In general, dielectrophoretic motion of a neutral thermally conductive particle that is polarized occurs in response to a force exerted on a neutral thermally conductive particle when it is subjected to a non-uniform electric field. The dielectrophoresis force generates movement that is dependent on the gradient of the electric field. The gradient of the electric field is generated by changing the phase of the electric field, using asymmetric electrodes (e.g., electrodes having different geometries, non-uniform shapes, or formed using different materials), or other suitable technique.

In at least one embodiment of thermal management system 200, the non-uniform electric field is a non-uniform alternating current (AC) electric field or a non-uniform direct current (DC) electric field. The force exerted on the thermally conductive particles by AC dielectrophoresis is controlled by adjusting field parameters, e.g., magnitude, frequency, wave shape, wave symmetry, and phase. The sign and magnitudes of dipoles induced in the thermally conductive particles are given by the real part of the Clausius-Mossotti function K:

$$Re|K| = \frac{\varepsilon_2 - \varepsilon_1}{\varepsilon_2 + 2\varepsilon_1} + \frac{3(\varepsilon_1 \sigma_2 - \varepsilon_2 \sigma_1)}{(\sigma_2 + 2\sigma_1)^2(1 + \omega^2 \tau_{MW}^2)},$$

where $\varepsilon_1$ is dielectric permittivity of the fluid, $\sigma_1$ is conductivity of the fluid, $\varepsilon_2$ is dielectric permittivity of the thermally conductive particle, $\sigma_2$ is conductivity of the thermally conductive particle, $$\tau_{MW} = \frac{\varepsilon_2 + 2\varepsilon_1}{\sigma_2 + 2\sigma_1}$$

is the Maxwell-Wagner charge relaxation time, and $\omega$ is the AC field frequency.

In general, dielectrophoretic effects cause structuring when higher concentrations of thermally conductive particles are present between the electrodes. In various embodiments, the particle size varies from nanometers to micrometers. The dipoles induced in the thermally conductive particles interact with each other if the thermally conductive particles are close enough. The thermally conductive particles align in chains along the direction of field lines. The chaining force $F_{chain}$ is dependent on the field strength squared $E^2$ and the radius squared of the particle, $r^2$:

$$F_{chain} = -C\pi\varepsilon_1 r^2 K^2 E^2,$$

where coefficient C ranges from 3 to >10³, depending on the distance between thermally conductive particles and the length of the chain. The chaining force acting on thermally conductive particles of similar electrical properties is positive and attractive. In at least one embodiment, the thermally conductive particles, fluid, concentration of the thermally conductive particles in the fluid, and the AC field parameters are selected to cause particle structuring or chaining in response to an AC or DC electric field generated by selectively enabled electrodes of integrated circuit product 202 and heat exchanger 210.

Thermal management system 200 applies an AC signal or DC signal to at least one selectively enabled pair of electrodes to generate an AC field or DC field, respectively, across thermal interface material 208. In some embodiments, thermal management system applies pulses of charge using selectively enabled electrodes to cause small motion of thermally conductive particles in thermal interface material 208 that enhance heat transfer. Each selectively enabled pair of electrodes includes an electrode on a surface of integrated circuit product 202 and an electrode on a surface of heat exchanger 210. In an embodiment of thermal management system 200, electrode 214 selected from a plurality of electrodes on the backside of integrated circuit product 202 and electrode 212 of heat exchanger 210 are asymmetric. For example, electrode 214 has a different thickness or shape than electrode 212, even if both sets of electrodes are formed from the same material (e.g., a thin film conductor). In at least one embodiment, different numbers of electrodes on the surfaces of integrated circuit product 202 and heat exchanger 210 are selected to generate the asymmetric electric field across thermal interface material 208. Thermal management system 200 selects at least one electrode on a surface of heat exchanger 210 that is in contact with thermal interface material 208 and at least one electrode on a surface of integrated circuit product 202 that is in contact with thermal interface material 208 to generate the non-uniform electric field that causes some of the thermally conductive particles in thermal interface material 208 to excite, concentrate, or align and form a high thermal conductivity path between the surfaces of integrated circuit product 202 and heat exchanger 210.

Figure 5:
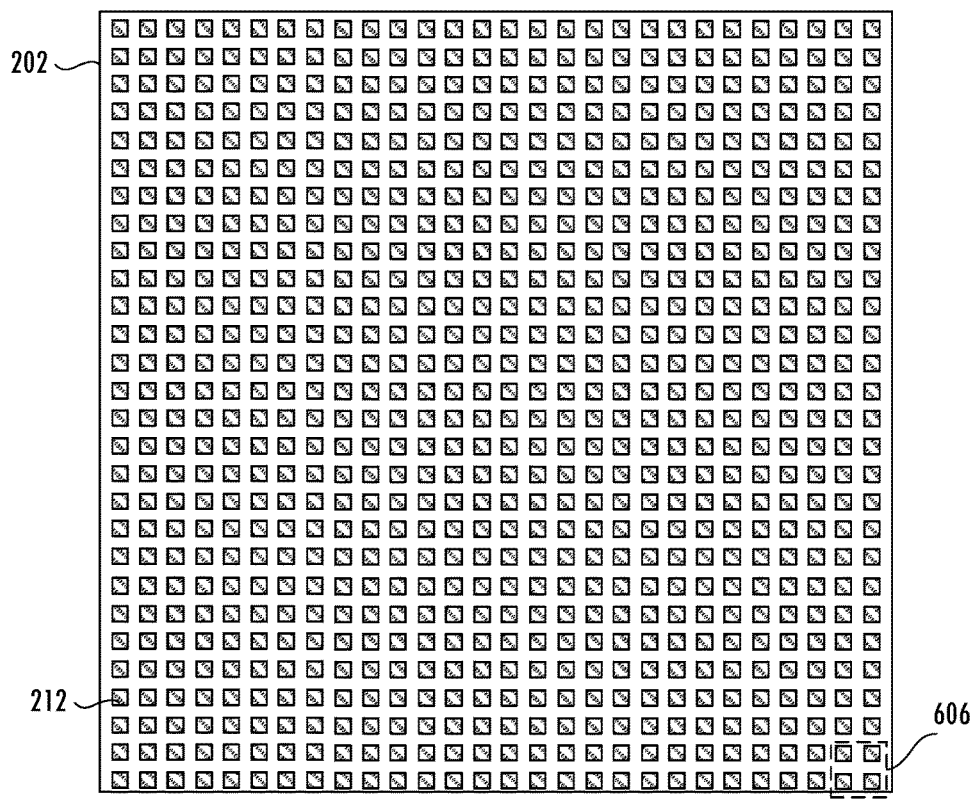
FIG. 5 illustrates a plan view of a surface of a heat exchanger or an integrated circuit product including electrodes consistent with at least one embodiment of the invention.

Referring to FIG. 5, in at least one embodiment, an array of thin film electrodes 212 and associated electrical routing (not shown) are formed on a surface of integrated circuit product 202 (e.g., the backside of integrated circuit product 202). Electrodes 212 are formed using conventional integrated circuit manufacturing techniques, e.g., forming a dielectric layer, forming one or more conductive layers (e.g., metal layers or redistribution layers), and patterning the conductive layers (e.g., applying photoresist, selectively exposing the photoresist using a reticle including a conductive pad pattern, and removing unwanted material). Note that the geometry, spacing, and shape of the electrodes will vary with application.

Figure 6:
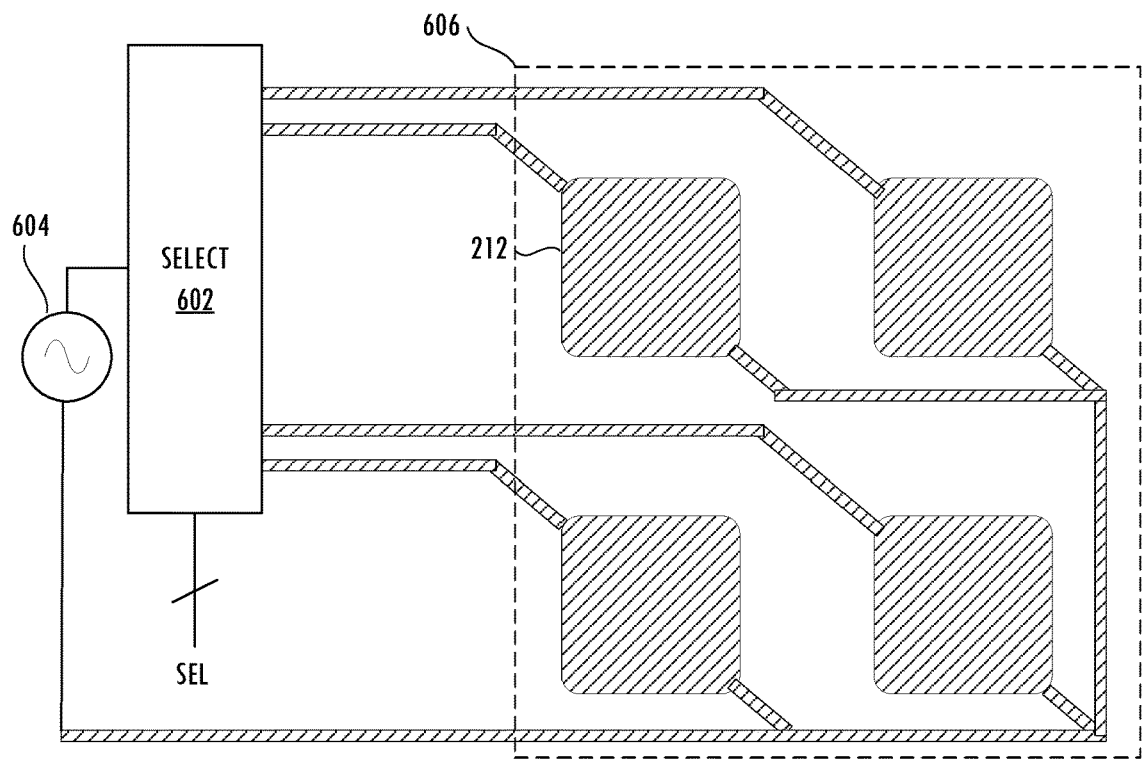
FIG. 6 illustrates a detailed view of electrodes of FIG. 5 and functional blocks for providing associated control signals consistent with at least one embodiment of the invention.
Figure 7:
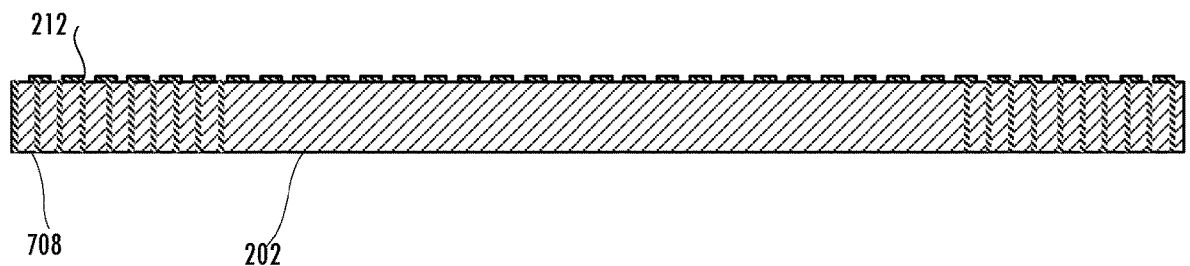
FIG. 7 illustrates a cross-sectional view of the integrated circuit product of FIG. 3 including through-silicon vias consistent with at least one embodiment of the invention.

Referring to FIG. 6, which illustrates a detailed view of subset 606 of the electrodes of FIG. 5, select circuit 602 receives digital code SEL that identifies one or more of the electrodes to select to receive power from power supply 604 independently from the other electrodes. Non-selected electrodes are coupled to ground or other power supply voltage. In at least one embodiment, select circuit 602 is included on the surface of integrated circuit product 202 and digital code SEL is received from the active side of integrated circuit product 202. In other embodiments, select circuit 602 is included on the active side of integrated circuit product 200 and the selected electrodes receive power from selectively enabled power signals received from the active side of integrated circuit product 202. Referring to FIG. 7, in at least one embodiment, control or power signals are received from the active side of integrated circuit product 202 using through-silicon vias. Through-silicon vias 708 are vertical interconnect structures that pass completely through a die of integrated circuit product 202. For example, through-silicon vias 708 are formed using wafer backside lithography, deep silicon etching, silicon dioxide etching (e.g., reactive ion etch (ME)) with a photoresist mask, side wall insulation deposition (e.g., low-temperature plasma-enhanced chemical vapor deposition (PECVD), silicon dioxide deposition, and subsequent silicon dioxide ME), and conductive material processing. In other embodiments, the active side of integrated circuit product 200 provides digital code SEL to a digital signal interface and external conductors provide the digital code SEL to a port on the backside of integrated circuit product 200.

Heat exchanger 210 includes a second set of one or more electrodes. In at least one embodiment, the electrodes are formed on a passivation layer (e.g., silicon-nitride). Although the first set of electrodes and the second set of one or more electrodes are described as including a plurality of electrodes, in at least one embodiment, the second set of electrodes includes only one electrode. In at least one embodiment, heat exchanger 210 is a thermally and electrically conductive plate that is coupled to a ground node of the power supply and serves as the only electrode of a second set of electrodes of the heat exchanger and thermal management system 200 only selectively enables electrodes in the first set of electrodes on the backside of integrated circuit product 202.

Figure 8:
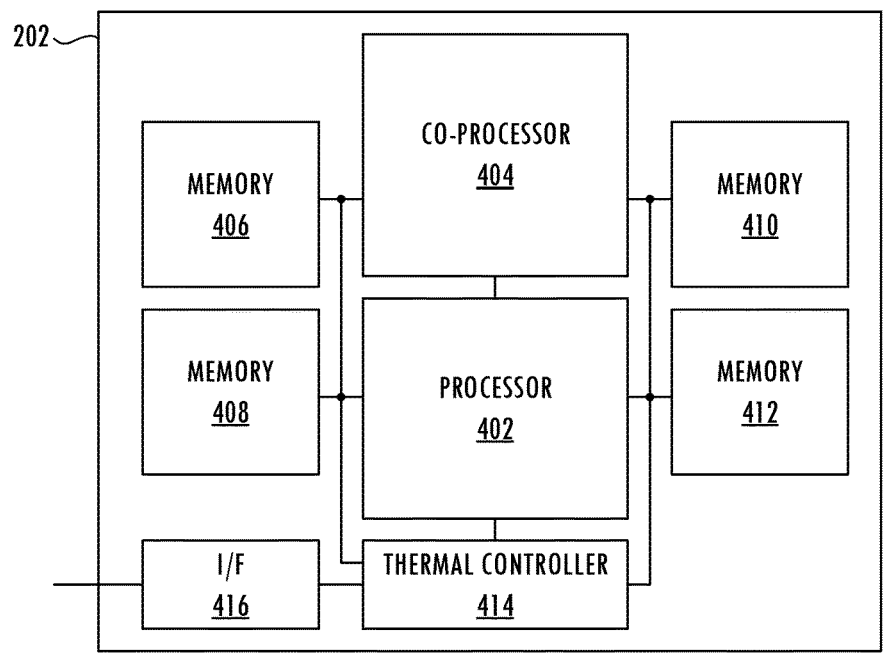
FIG. 8 illustrates a functional block diagram of an active side of the integrated circuit product of FIG. 4 consistent with at least one embodiment of the invention.

Referring to FIG. 8, in at least one embodiment, integrated circuit product 202 includes processor 402, co-processor 404, memory circuits 406, 408, 410, and 412, interface 416, and thermal controller 414. In at least one embodiment, processor 402 is a microprocessor, central processing unit, graphics processing unit, accelerated processing unit, digital signal processor, or other processing circuit. In some embodiments, a separate thermal controller 414 is not included. In other embodiments, thermal controller 414 is implemented using software (which includes firmware) executing on processor 402 or co-processor 404 or by a combination of software and hardware. Software, as described herein, may be encoded in memory 406, 408, 410, or 412 or at least one other tangible (i.e., non-transitory) computer readable medium. As referred to herein, a tangible computer-readable medium includes at least a disk, tape, or other magnetic, optical, or electronic storage medium.

In an embodiment of thermal management system 200, thermal controller 414 generates digital code SEL and communicates digital code SEL or the associated selectively enabled power signals to backside of integrated circuit product 202. In some embodiments, digital code SEL also includes signals that interface 416 communicates to heat exchanger 210 via external signals for selectively enabling at least one electrode of the second set of electrodes of heat exchanger 210. In at least one embodiment, thermal controller 414 includes temperature sensors (e.g., diodes on integrated circuit product 202) that are distributed across the active side of integrated circuit product 202. The temperature sensors provide temperature information to thermal controller 414 to identify hot spots of integrated circuit product 202 during operation. In at least one embodiment, thermal controller 414 determines temperature differences for a region of the integrated circuit product and other regions of integrated circuit product 210 and compares those temperature differences to a threshold temperature difference that corresponds to a hot spot, to detect a hot spot of integrated circuit product 202.

Referring to FIGS. 3, 4, and 8, in an embodiment, thermal controller 414 uses workload information for integrated circuit product 200 as a proxy for temperature information or in addition to temperature information to identify hot spots of integrated circuit product 202. For example, thermal controller 414 can use workload information (e.g., program flow information) for processor 402 and co-processor 404. If the workload information indicates that co-processor 404 is operating in a high-power mode, thermal controller 414 enables one or more electrodes proximate to co-processor 404 to generate one or more corresponding high thermal conductivity path (e.g., high thermal conductivity path 216 or high thermal conductivity path 218) between hot spots of integrated circuit product 202 generated by co-processor 404 and heat exchanger 210. In an embodiment, thermal controller 414 periodically performs hot spot detection and updates the selected electrodes to change the location of a high thermal conductivity path between a hot spot and heat exchanger 210 or generates additional high thermal conductivity path between additional hot spots and heat exchanger 210. In at least one embodiment, thermal controller 414 receives information regarding which core of a multi-core integrated circuit executes a workload and thermal controller 414 updates selected electrodes to generate a high thermal conductivity path between a hot spot associated with the core executing the workload and heat exchanger 210. Thermal controller 414 updates the selected electrodes to generate a high thermal conductivity path in another location executing the workload or to disable the path and randomly disperse the thermally conductive particles through the thermal interface material for uniform cooling of all cores of the integrated circuit die.

Figure 9:
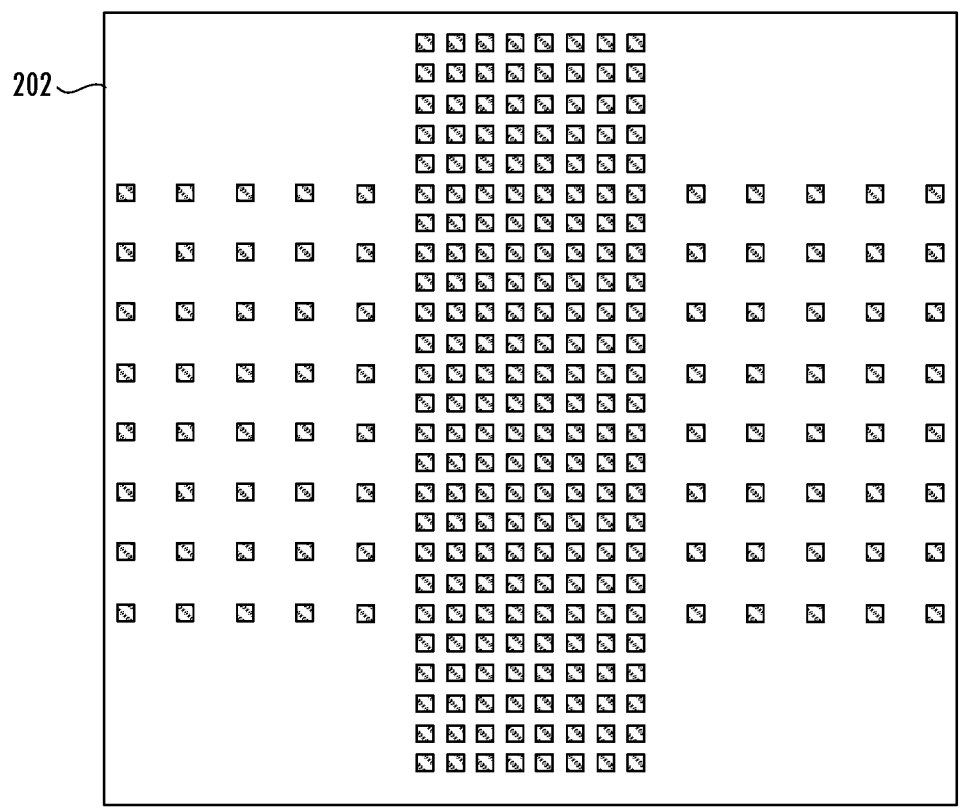
FIG. 9 illustrates a plan view of a surface of a heat exchanger or an integrated circuit product including electrodes disposed in accordance with a power density map consistent with at least one embodiment of the invention.

If program flow indicates that co-processor 404 is operating in a low-power mode, thermal controller 414 disables the associated electrodes for a previously enabled high thermal conductivity path. In an embodiment, the first set of electrodes on the backside of integrated circuit product 202 is tailored to predetermined hot spots of integrated circuit product 202, having higher density in a region associated with higher power consumption and lower density in regions associated lower power consumption, as illustrated in FIG. 9. Although the electrodes of FIGS. 5, 6, and 9 are illustrated as square conductive pads, in other embodiments, the electrodes have different geometries (e.g., rectangular, rhombus, or irregular shape).

While the thermal management system has been described in embodiments in which dielectrophoretic force is used to align thermally conductive particles suspended in a thermal interface material to reduce the thermal resistance of a path in the thermal interface material between hot spots of integrated circuit product 202 and heat exchanger 210, one of skill in the art will appreciate that the teachings herein can be utilized with electrophoresis, magnetophoretic migration of thermally conductive particles, or electromagnetophoretic migration of thermally conductive particles to generate high thermal conductivity paths of the thermal interface material between hot spots of integrated circuit product 202 and heat exchanger 210. For example, in an embodiment, thermal interface material 208 includes magnetic thermally conductive particles (e.g., iron-oxide particles coated in gold) and a magnetic field gradient causes magnetophoretic migration of the thermally conductive particles to form a path with high thermal conductivity as compared to the thermal conductivity of a fluid with randomly distributed thermally conductive particles. An embodiment using electromagnetophoresis uses electrodes or real magnets to generate a magnetic field that exerts a force on the particles to excite, translate, or align particles to form a path with high thermal conductivity as compared to the thermal conductivity of a fluid with randomly distributed thermally conductive particles using migration of the thermally conductive particles due to the Lorenz force generated by simultaneous application of an electric current and magnetic field to the thermally conductive particles.

Thus, thermal management techniques that cool hot spots without over cooling other portions of an integrated circuit product have been described. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A thermal management system comprising:
an integrated circuit having an active side including a control circuit and a backside including a first set of electrodes distributed across the backside;
a heat exchanger having a surface including a second set of electrodes; and
a thermal interface material including thermally conductive particles suspended in a fluid, the thermal interface material being disposed between the backside of the integrated circuit and the surface of the heat exchanger, the thermal interface material being in contact with the backside of the integrated circuit and the surface of the heat exchanger,
wherein the control circuit is configured to apply an electric field to the thermal interface material using a first electrode of the first set of electrodes and a second electrode of the second set of electrodes to excite at least some of the thermally conductive particles between the first electrode and the second electrode.

2. The thermal management system, as recited in claim 1, wherein the electric field is a non-uniform electric field.

3. The thermal management system, as recited in claim 1, wherein the electric field causes at least some of the thermally conductive particles to form a high thermal conductivity path of the thermal interface material between the first electrode and the second electrode, the high thermal conductivity path having a lower thermal resistance than a region of the thermal interface material having randomly distributed thermally conductive particles suspended in the fluid.

4. The thermal management system, as recited in claim 1, wherein the first electrode is proximate to a hot spot location of the integrated circuit.

5. The thermal management system, as recited in claim 1, wherein the electric field is generated using an alternating current provided by the integrated circuit.

6. The thermal management system, as recited in claim 1, wherein the electric field is an alternating current field having a magnitude, frequency, wave shape, and phase determined by the control circuit.

7. The thermal management system, as recited in claim 1, wherein a radius, a first permittivity, and a first conductivity of the thermally conductive particles, and a second permittivity and a second conductivity of the fluid have values that cause chaining of the thermally conductive particles in the fluid in response to the electric field.

8. The thermal management system, as recited in claim 1, wherein the first electrode and the second electrode are an asymmetric pair of electrodes.

9. The thermal management system, as recited in claim 1, wherein the control circuit is configured to select the first electrode from the first set of electrodes based on a hot spot location.

10. The thermal management system, as recited in claim 9, further comprising:
a plurality of sensors configured to sense local temperatures of the integrated circuit,
wherein the hot spot location is identified based on temperature information provided by the plurality of sensors.

11. The thermal management system, as recited in claim 9, wherein the hot spot location is identified based on workload information of the integrated circuit.

12. The thermal management system, as recited in claim 9, wherein the control circuit is configured to periodically update the hot spot location and enable a third electrode of the first set of electrodes according to an updated hot spot location.

13. The thermal management system, as recited in claim 1, wherein the control circuit comprises:
a storage element; and
a processor configured to execute instructions stored in the storage element and executable by the processor to cause the processor to generate signals to apply the electric field to the thermal interface material.

14. A method for thermal management of an integrated circuit product, the method comprising:
selecting a first electrode from a first set of electrodes distributed across a backside of an integrated circuit and a second electrode of a second set of electrodes of a surface of a heat exchanger; and
applying an electric field across a thermal interface material using the first electrode and the second electrode, the thermal interface material including thermally conductive particles suspended in a fluid, the thermal interface material being disposed between the backside of the integrated circuit and the surface of the heat exchanger, the thermal interface material being in contact with the backside of the integrated circuit and the surface of the heat exchanger, the electric field exciting at least some of the thermally conductive particles between the first electrode and the second electrode.

15. The method, as recited in claim 14, wherein the electric field is a non-uniform electric field.

16. The method, as recited in claim 14, wherein the electric field causes at least some of the thermally conductive particles to align, thereby forming a high thermal conductivity path of the thermal interface material between the first electrode and the second electrode, the high thermal conductivity path having a lower thermal resistance than a region of the thermal interface material having randomly distributed thermally conductive particles suspended in the fluid.

17. The method, as recited in claim 14, wherein the first electrode is proximate to a hot spot location of the integrated circuit.

18. The method, as recited in claim 14, wherein the electric field is generated using an alternating current.

19. The method, as recited in claim 14, further comprising:
identifying a hot spot location of the integrated circuit, wherein the first electrode is selected based on the hot spot location.

20. The method, as recited in claim 19, further comprising:
sensing local temperatures of the integrated circuit,
wherein the hot spot location is identified based on the local temperatures.

21. The method, as recited in claim 19, wherein the hot spot location is identified based on workload information.

22. The method, as recited in claim 19, further comprising:
periodically updating the hot spot location of the integrated circuit and enabling a third electrode of the first set of electrodes according to an updated hot spot location.

23. The method, as recited in claim 14, wherein the thermally conductive particles suspended in the fluid are electrically conductive particles.

24. The method, as recited in claim 14, wherein a radius, a first permittivity, and a first conductivity of the thermally conductive particles and a second permittivity and a second conductivity of the fluid have values that cause chaining of the thermally conductive particles in the fluid in response to the electric field.

25. A method for manufacturing a thermal management system, the method comprising:
providing an integrated circuit having an active side including a control circuit and a backside including a first set of electrodes distributed across the backside;
providing a heat exchanger having a surface including a second set of electrodes; and
providing a thermal interface material including thermally conductive particles suspended in a fluid, the thermal interface material being disposed between the backside of the integrated circuit and the surface of the heat exchanger, the thermal interface material being in contact with the backside of the integrated circuit and the surface of the heat exchanger,
wherein the control circuit is configured to apply an electric field to the thermal interface material using a first electrode of the first set of electrodes and a second electrode of the second set of electrodes to excite at least some of the thermally conductive particles between the first electrode and the second electrode.

26. The method, as recited in claim 25, further comprising:
forming the first set of electrodes on the backside of the integrated circuit;
forming a passivation layer on the surface of the heat exchanger; and
forming the second set of electrodes electrically isolated from the heat exchanger by the passivation layer.

27. The method, as recited in claim 25, wherein a radius, a first permittivity, and a first conductivity of the thermally conductive particles and a second permittivity and a second conductivity of the fluid have values that cause chaining of the thermally conductive particles in the fluid in response to the electric field.

28. The method, as recited in claim 25, wherein the first electrode and the second electrode are an asymmetric pair of electrodes.

29. The thermal management system manufactured by the method recited in claim 25.

30. An apparatus comprising:
an integrated circuit;
a heat exchanger; and means for varying a thermal resistance of a thermal interface material between the integrated circuit and the heat exchanger by exciting at least some thermally conductive particles suspended in a fluid of the thermal interface material to form a high thermal conductivity region between a hot spot of the integrated circuit and the heat exchanger, the high thermal conductivity region having a lower thermal resistance than a region of the thermal interface material having randomly distributed thermally conductive particles suspended in the fluid.

\* \* \* \* \*